United States Patent
Paredis et al.

(10) Patent No.: US 10,495,666 B2
(45) Date of Patent: Dec. 3, 2019

(54) DEVICE AND METHOD FOR TWO DIMENSIONAL ACTIVE CARRIER PROFILING OF SEMICONDUCTOR COMPONENTS

(71) Applicant: IMEC vzw, Leuven (BE)

(72) Inventors: Kristof Paredis, Oud-Heverlee (BE); Umberto Celano, Leuven (BE); Wilfried Vandervorst, Mechelen (BE); Oberon Dixon-Luinenburg, Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/026,428

(22) Filed: Jul. 3, 2018

(65) Prior Publication Data
US 2019/0025341 A1 Jan. 24, 2019

(30) Foreign Application Priority Data

Jul. 18, 2017 (EP) .................... 17181780

(51) Int. Cl.
*G01Q 60/30* (2010.01)
*G01R 27/02* (2006.01)
*H01L 21/66* (2006.01)

(52) U.S. Cl.
CPC .......... *G01Q 60/30* (2013.01); *G01R 27/02* (2013.01); *H01L 22/14* (2013.01)

(58) Field of Classification Search
USPC ......................................... 850/36
See application file for complete search history.

(56) References Cited

U.S. PATENT DOCUMENTS

| | | | |
|---|---|---|---|
| 6,912,894 B2* | 7/2005 | Prakash | G01Q 60/30 73/105 |
| 9,588,137 B2* | 3/2017 | Eyben | H01L 22/14 |
| 9,823,208 B2* | 11/2017 | Watanabe | G01N 27/041 |
| 2002/0157457 A1* | 10/2002 | Vandervorst | B82Y 35/00 73/105 |
| 2016/0290945 A1 | 10/2016 | Watanabe et al. | |

FOREIGN PATENT DOCUMENTS

EP 2706560 A2 3/2014

OTHER PUBLICATIONS

Extended European Search Report dated Jan. 26, 2018 in related European Application No. 17181780.2.

* cited by examiner

*Primary Examiner* — Phillip A Johnston
(74) *Attorney, Agent, or Firm* — Knobbe Martens Olson & Bear, LLP (57) ABSTRACT

A method of measuring an electrical characteristic of a current path is disclosed. In one aspect, the method includes a probe for scanning spreading resistance microscopy (SSRM), a test sample contacted by the probe, a back contact on the test sample, a bias voltage source and a logarithmic SSRM amplifier, when a modulation at a predefined frequency is applied to either the contact force of the probe or to the bias voltage, the device comprising electronic circuitry for producing in real time a signal representative of the electrical characteristic, according to the formula $\log_n A = \pm V_{SSRM} \pm \log_n(dV) + V_{multiplier}$.

12 Claims, 4 Drawing Sheets

DEVICE AND METHOD FOR TWO DIMENSIONAL ACTIVE CARRIER PROFILING OF SEMICONDUCTOR COMPONENTS

CROSS-REFERENCE TO RELATED APPLICATIONS

This application claims foreign priority to European Patent Application No. 17181780.2, filed Jul. 18, 2017, the contents of which are incorporated by reference herein in their entirety.

BACKGROUND

Technological Field

The disclosed technology relates to a method of measuring active carrier concentration by scanning spreading resistance microscopy (SSRM).

Description of the Related Technology

Scanning spreading resistance microscopy is a well-established technique that enables repeatable quantitative carrier profiling, providing sub-nanometer resolution profiles/2D images with a very large dynamic range. SSRM is based on atomic force microscopy (AFM) wherein surface mapping of a test sample is performed with a sharp probe (tip radius less than 50 nm) in close proximity to the surface of a sample. Currents are measured in the picoampere (pA) to milliampere (mA) regime, so the probe must be conductive and in good electrical contact with the surface. This contact is maintained while scanning across the surface by monitoring the position of a laser spot reflected from the cantilever holding the probe. Maintaining a constant deflection of the laser from a reference point on the photodetector by moving the probe tip along an axis perpendicular to the sample (referred to as the Z-axis) in response to the surface topography ensures that the tip-sample force is constant. The good electrical contact required for SSRM necessitates large forces, so boron-doped diamond tips are used to reduce the chance of damage and wear to the probe.

With a stable contact, a bias is applied to the back of the sample and any current that flows through the tip to ground is amplified logarithmically (standard by a base 10 logarithm) by the SSRM amplifier. The base-10 log of the current through the tip is compared with the base-10 log of the current resulting from the same bias voltage through a reference resistor, to yield the base-10 log of the resistance, with an effective range of from k$\Omega$ to T$\Omega$. This resistance can be modelled as a sum of several resistances in series, as in equation (1).

$$R_{SSRM} = R_{spreading} + R_{tip} + R_{intervening} + R_{back\ contact} = R_{spreading} + R_{series} \quad (1)$$

The back-contact resistance is that of the electrical contact to the back of the sample. This is generally negligible if the contact is to the substrate but can be significant if the contact is to a small area, such as when a region of a device is isolated from the substrate and must be connected via a several square micron metallic FIB contact to the back of the sample. The intervening resistance is that between the back-contact and the surface, made up of the resistance of any junctions or long confined volumes. The tip resistance is that of the diamond tip, between 1 and 10 k$\Omega$, which is comprised of a constant component and a contact force dependent component. Finally, the spreading resistance is the confined-volume resistance from the nanoscale contact of the probe tip to the bulk, described by Maxwell's approximation in equation (2).

$$R_{spreading} = \frac{\rho}{4a} \quad (2)$$

The spreading resistance depends on the resistivity p and the contact area a. The contact area can be modelled in many ways but will be constant for the same probe, measurement conditions and applied force. Resistivity in semiconductors is a function of the material and the activate carrier concentration. Therefore, as long as the spreading resistance dominates the SSRM resistance, the SSRM measurement carries information about the resistivity and activate carrier concentration. With curve fitting based on a reference sample with a known bulk resistivity-resistance relationship, one can convert a 2D SSRM map into a 2D resistivity or active carrier concentration map.

However, in cases where the series resistance $R_{series}$ becomes significant relative to the spreading resistance $R_{spreading}$, information may be lost. The tip resistance is partially coupled to the contact force but otherwise constant, so if the calibration is done with the same tip and with the same parameters as the measurement needing quantification one does not lose the ability to relate resistance to resistivity. However, in highly doped regions where the spreading resistance is on the order of 10 k$\Omega$ the contrast diminishes, which results in increased imprecision for quantification. On the other hand, back contact and intervening resistances are structure-dependent and thus cannot be assumed to be consistent between different samples. When these resistances are significant relative to the spreading resistance one can no longer directly interpret the SSRM resistance because it cannot be known what fraction is series versus spreading resistance.

To deal with these challenges, Fast Fourier Transform SSRM (FFT-SSRM) was developed, as described for example in document EP-A-2706560. The principle is to add a modulation to the Z axis movement of the probe. Because the contact area is dependent on force and force is linear with deflection, a Z-modulation creates a modulation in the spreading resistance via equation (2). The modulation can be applied by adding a small AC signal to the photodetector deflection signal, relying on the tool feedback to move the probe in response as it tries to keep the deflection constant. As the other resistances from equation (1) are not influenced by the modulation of the force, the spreading resistance modulation dR can be filtered out of the SSRM signal by a Fast Fourier Transform of the SSRM signal.

A difficulty of the FFT-SSRM approach is the fact that the SSRM signal is the output of a logarithmic amplifier, so that there is no unique relation between the spreading resistance dR at the modulation frequency and the corresponding SSRM signal dV at this same frequency. The determination of dR therefore requires the conversion of the SSRM signal V+dV using the transfer function of the logarithmic amplifier to obtain a signal that represents R+dR. The latter signal is then treated by FFT to obtain dR. This calculation-based extraction of dR is complex and does not allow dR to be obtained in real time during the modulated SSRM measurement.

SUMMARY OF CERTAIN INVENTIVE ASPECTS

It is an object of the disclosed technology to provide a method and a device that can generate the spreading resistance modulation dR of an SSRM in real time. This is achieved by the device and method according to the appended claims.

The disclosed technology is firstly related to a device for measuring an electrical characteristic of a current path that includes a probe for scanning spreading resistance microscopy (SSRM), a test sample contacted by the probe, a back contact on the test sample, a bias voltage source ($V_b$) and a logarithmic SSRM amplifier, when a modulation at a predefined frequency is applied to either the contact force of the probe or to the bias voltage, the device comprising electronic circuitry for producing in real time a signal representative of the electrical characteristic, according to the formula:

$$\log_n A = \pm V_{SSRM} \pm \log_n(dV) + V_{multiplier}$$

where:
A is the electrical characteristic,
n is the base of the logarithmic function applied in the logarithmic SSRM amplifier,
$V_{SSRM}$ is the DC component of the signal produced by the logarithmic SSRM amplifier,
$\log_n(dV)$ is the logarithm of the modulation of the signal produced by the logarithmic amplifier, at the frequency of the modulation applied to either the contact force of the probe or to the bias voltage (Vb),
$V_{multiplier}$ is a constant that depends on the type of electric characteristic that is measured, and the plus or minus signs depend on the sign of the bias voltage ($V_b$) and on the type of characteristic that is measured.

According to an embodiment, the device further comprises circuitry for producing a drive signal ($V_d$) for driving the contact force or the bias voltage.

According to an embodiment, the device further comprises a tuneable resistor configured to be included in the current path.

According to an embodiment, the electric characteristic is the modulation dR of the resistance of said current path, when a modulation is applied to the contact force and wherein $V_{multiplier}$ is $\log_n(\ln 10/g)$ with g an integer.

The device of the disclosed technology may be produced as an electrical apparatus configured to be added to an SSRM measurement setup, the apparatus comprising input connections for receiving signals representative of $V_{SSRM}$ and dV and at least one output connection for delivering a signal representative of $\log_n A$. The SSRM measurement setup may be a setup as known in the art. In this case, the device of the disclosed technology is a stand-alone apparatus coupled to the controller of an SSRM tool included in said measurement setup. Alternatively, the apparatus may be integrated into the controller of an SSRM tool.

According to an embodiment, the input connection for receiving a signal representative of dV is configured to be coupled to a lock-in amplifier arranged to produce said signal in real time.

The device according to the disclosed technology may further comprise manual interfaces. These manual interfaces may comprise an interface that allows to select which electrical parameter is to be measured.

A device according to the disclosed technology may comprise a summing circuit comprising inputs configured to receive signals which are respectively representative of $\pm V_{SSRM}$, $\pm \log_n(dV)$ and $V_{multiplier}$.

The device of the disclosed technology may be configured to allow a reference voltage to be connected to the input configured to receive a signal representative of $\pm V_{SSRM}$, instead of said signal representative of $\pm V_{SSRM}$.

The disclosed technology is equally related to a method for measuring an electrical characteristic of a current path that includes a probe for scanning spreading resistance microscopy (SSRM), a test sample contacted by the probe, a back contact on the test sample, a bias voltage source ($V_b$) and a logarithmic SSRM amplifier, comprising:
applying a modulation at a predefined frequency to either the contact force of the probe or to the bias voltage (Vb),
measuring the output voltage $V_{SSRM}$ dV of the logarithmic SSRM amplifier, wherein $V_{SSRM}$ is the DC component of the signal produced by the logarithmic SSRM voltage amplifier and wherein dV is the modulation of the signal produced by the logarithmic amplifier, at the frequency of the modulation applied to either the contact force of the probe or to the bias voltage,
determining dV by a lock-in amplifier,
determining $V_{SSRM}$,
calculating the electrical characteristic on a logarithmic scale in real time by the function:

$$\log_n A = \pm V_{SSRM} \pm \log_n(dV) + V_{multiplier},$$

where: A is the electrical characteristic, n is the base of the logarithmic function applied in the logarithmic SSRM amplifier, $V_{multiplier}$ is a constant that depends on the type of electric characteristic that is measured,
and the plus or minus signs depend on the sign of the bias voltage ($V_b$) and on the type of characteristic that is measured.

According to an embodiment of the method of the disclosed technology, a modulation is applied to the contact force, and the electric characteristic is the modulation dR of the resistance of said current pat, and wherein $V_{multiplier}$ is $\log_n(\ln 10/g)$ with g an integer.

DETAILED DESCRIPTION OF CERTAIN ILLUSTRATIVE EMBODIMENT

Figure 1:
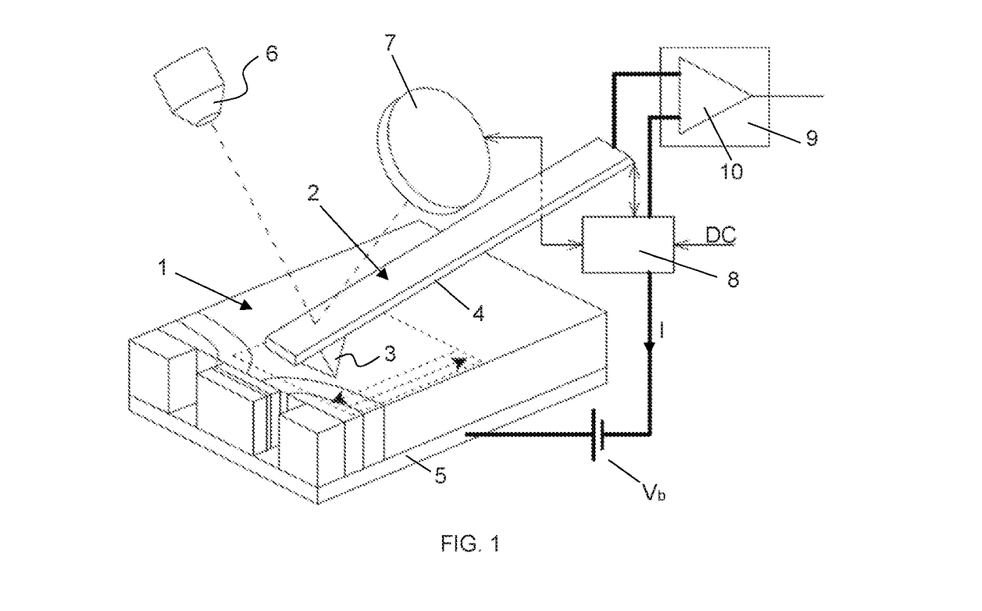
FIG. 1 illustrates a typical SSRM measurement setup as known in the prior art.

FIG. 1 illustrates the measurement setup of an SSRM measurement known in the art. The sample 1 is typically comprised of various materials, often including doped semiconducting materials. Measurements are performed either on top (parallel to the wafer surface) or on cross sections (a cut perpendicular to the wafer surface) of a sample. An AFM probe 2 comprising a tip 3 mounted on a cantilever 4 is scanned across the sample as in regular AFM, while a known bias voltage $V_b$ is applied between the probe and a back contact 5 provided underneath the sample. The setup further comprises a laser 6 and a photodetector 7. A laser beam produced by the laser is reflected at a spot on the cantilever 4. The reflected beam is detected by the photodetector 7. The laser spot moves as a function of the topography of the sample. This movement is detected by the photodetector 7 and used as input for a controller 8. The controller receives as a second input signal a DC signal at a given level. The combined input signals are translated by the controller 8 into an output signal that controls the movement of the cantilever in the direction of the Z-axis, in order to maintain a constant tip-sample force, thereby ensuring a continuous electrical contact between the tip and the sample. This tip/sample contact closes a current path shown in bold lines, through which a current I flows. In FIG. 1 as in the other figures also, lines which are not shown in bold type indicate dedicated input or output channels, possibly with signal paths in two directions, as indicated by the arrows. The SSRM analyser 9 comprises a logarithmic amplifier 10 configured to measure the current I and convert the current to an output signal $V_{SSRM}$ that is proportional to the logarithm of the resistance of the current path R as defined by equation (1) given in the introductory section. In FIG. 1 as in all the other figures, the controller 8 is included in the current path but should not be regarded as representing a significant resistance in addition to the resistance given in formula (1).

Figure 2:
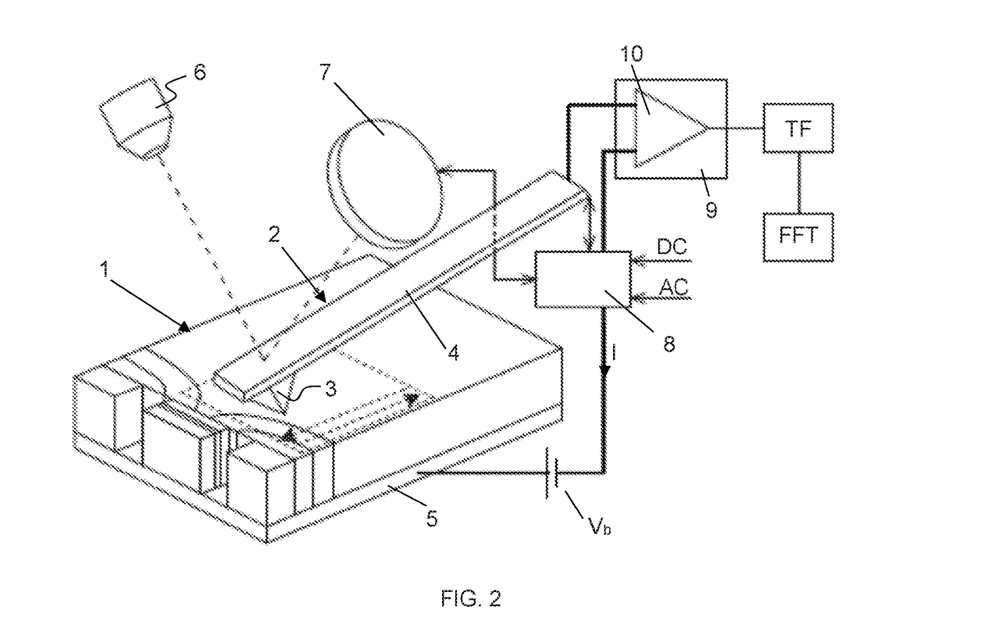
FIG. 2 illustrates the setup for FFT-SSRM, equally known in the art.

In FFT-SSRM, illustrated in FIG. 2, a modulation component dZ is added to the Z-movement of the probe, resulting in a force F+dF being applied to the sample, with F constant and with dZ and dF representing modulations at a predefined frequency. The modulations are obtainable by applying an AC signal at the predefined frequency to the input of the controller 8. The output of the SSRM tool is now $V_{SSRM}$+dV with dV the modulation component that is related to the modulated spreading resistance dR. dR is calculated by performing FFT on the signal but only after calculating each sample of dR by applying the transfer function TF of the log amplifier. As explained in the introductory portion, the calculation of dR therefore requires extensive computing power and precludes determination of the spreading resistance in real time. Possibly the dV value may be obtained directly from a lock-in amplifier 11 tuned to the known AC frequency of the modulation. This device is known per se and often inbuilt in SSRM tools. The AC modulation can be superposed on the bias voltage $V_b$ instead of on the Z-movement of the probe. The operator can set the controller 8 between these two options.

In the previous paragraph as well as in the following paragraphs which will be related to the disclosed technology, the signal at the output of the logarithmic amplifier is "$V_{SSRM}$+a periodic function at a predefined frequency f". In some embodiments, the periodic function is a sinusoidal function, for example A·sin ωt with A the amplitude and ω=2πf. The terms 'dV' and 'dR' are scalar values extracted from the periodic signal. They may refer to the amplitude as such (0-peak), to the peak-to-peak value, to the RMS value or other representative values. Within the context of this specification, the notation 'X+dX' is therefore an abbreviated version of 'X+a periodic function defined by a characteristic value dX'. The term 'the modulation dX' used in the specification and the claims refers to said characteristic value (i.e. a 0-peak, peak-to-peak, RMS or other).

Figure 3:
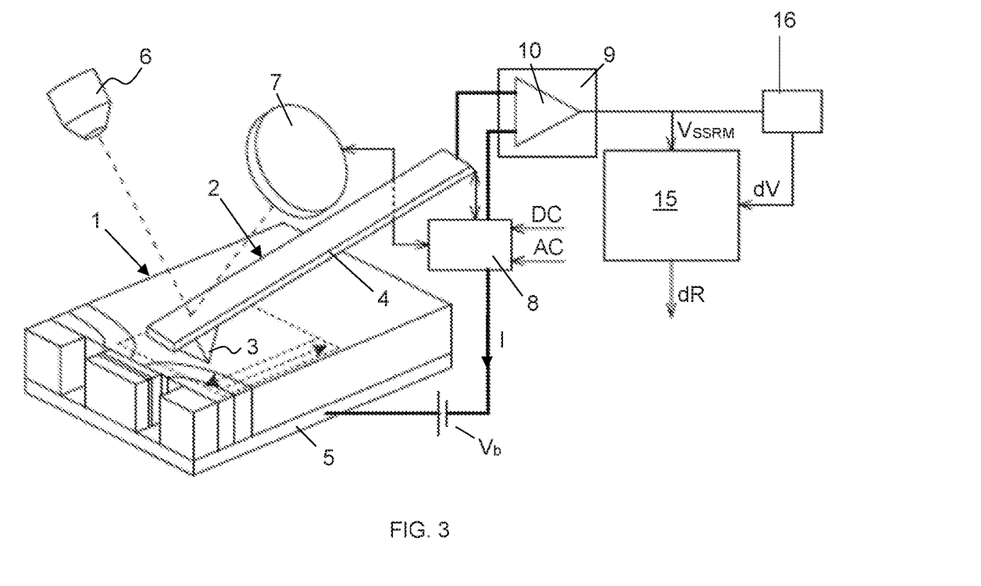
FIG. 3 illustrates an SSRM setup including a signal processing device in accordance with the disclosed technology.

The measurement setup including a device 15 according to an embodiment of the disclosed technology suitable for measuring dR in real time is shown in FIG. 3. The device 15 is configured to receive the DC part $V_{SSRM}$ of the SSRM signal as well as the dV signal coming from a lock-in amplifier 16 which receives the full signal $V_{SSRM}$+dV and which delivers a signal representative of dV to the device 15 in real time, allowing the device 15 to calculate dR in real time on the basis of the following formula for dR on a logarithmic scale:

$$\mathrm{Log}_{10} dR = V_{SSRM} + \log_{10}(dV) + \log_{10}(\ln 10) \quad (3)$$

The formula follows from a number of mathematical steps. As dR represents a modulation at a given pre-defined frequency, superimposed on $V_{SSRM}$, the following is true for dR regarded as the amplitude of the modulation:

$$2dR = \text{maximum resistance} - \text{minimum resistance} \quad (4)$$

As a consequence of the logarithmic relation between the resistance R and the voltage output of the SSRM tool, the following is also true:

$$\log_{10}(\text{max resistance}) = V_{SSRM} + dV$$

$$\log_{10}(\text{min resistance}) = V_{SSRM} - dV$$

Formula (4) can therefore be written as:

$$dR = \frac{1}{2}(10^{(V_{SSRM}+dV)} - 10^{(V_{SSRM}-dV)}) \quad (5)$$

This can in turn be written as:

$$dR = 10^{V_{SSRM}} \frac{1}{2}(e^{dV \ln 10} - e^{-dV \ln 10}) \quad (6)$$

And based on the definition of a hyperbolic sine function:

$$dR = 10^{V_{SSRM}} \sin h(dV \cdot \ln 10) \quad (7)$$

When dV is small compared to $V_{SSRM}$, this can be approximated by the first order approximation:

$$dR \approx 10^{V_{SSRM}} \sin h(dV \cdot \ln 10) \quad (8)$$

Taking the logarithm of formula (8) yields formula (3). In practice, the order of magnitude of the modulation amplitude dV can easily be controlled to be small relative to $V_{SSRM}$ so that formula (8) yields a very close approximation of the dR value, which justifies the equality sign applied in formula (3). Formula (8) has been derived as a relation between dR and dV regarded as the amplitudes of the respective modulations. The relation is however also true when dR and dV are reproduced as signals representative of the RMS values or peak-to-peak values of the modulated signals.

Figure 4:
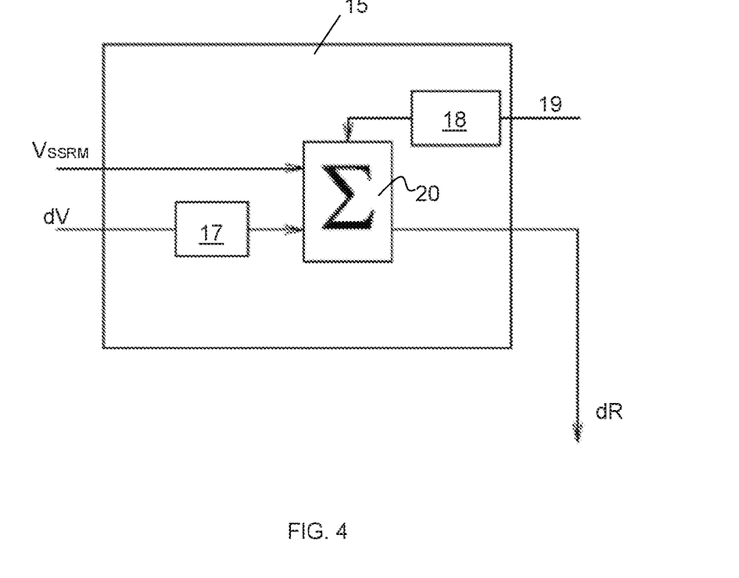
FIG. 4 shows the minimally required components of a device according to the disclosed technology, for measuring the modulated spreading resistance dR.

FIG. 4 is a schematic image of the building blocks of the signal processing device 15 according the disclosed technology and required for the setup of FIG. 3. The signal $V_{SSRM}$ is the DC component of the output signal of the SSRM analyzer 9, which can be easily extracted by using standard signal processing capabilities of most SSRM tools, for example by integrating the output signal of the amplifier 10. dV is the output of the lock-in amplifier 16. Alternatively, the lock-in amplifier may be capable of providing a signal representative of $V_{SSRM}$ as well as a signal representative of dV. A logarithmic voltage amplifier circuit 17 produces $\log_{10}(dV)$. An offset circuit 18 transforms an input 19 into a signal that represents ln 10 on the same scale as $V_{SSRM}$ and $\log_{10}(dV)$. A summing circuit 20 then reproduces formula (3), thereby producing a signal that is proportional to $\log_{10}(dR)$ and thus representative of dR. In some embodiments, the base of the logarithm calculated by the amplifier is 10, but may differ from that, hence the generalization in the appended claims involving a general logarithmic function with base n.

Figure 5:
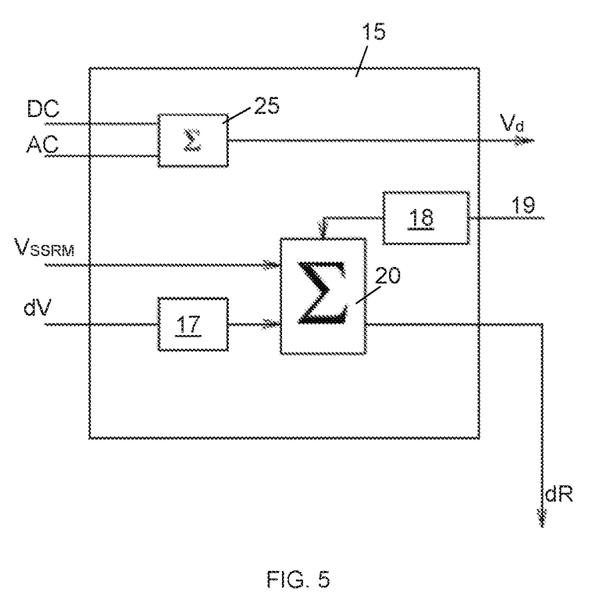
FIG. 5 shows an embodiment of the device, further comprising the capability of setting a DC and an AC voltage.
Figure 6:
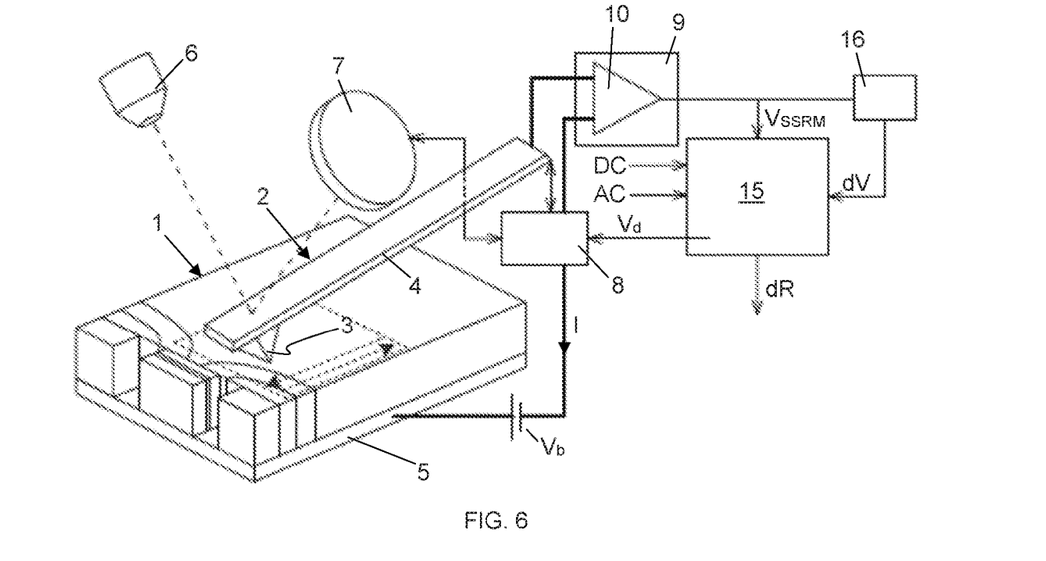
FIG. 6 shows the integration of the device of FIG. 5 into an SSRM measurement setup.

A further embodiment is illustrated in FIGS. 5 and 6. In FIG. 5, the signal processing device 15 of the disclosed technology includes two additional inputs for receiving a DC signal and an AC signal. These signals are added by an additional summing circuit 25, further comprising scaling circuitry for scaling the AC signal relative to the DC, and sent out as a drive signal $V_d$ for the AFM tool. The drive signal is translated in the AFM tool as a constant force F applied by the probe to the sample, with a modulation dF at the AC frequency superimposed thereon. The portion added to the device in FIG. 5 is not new per se, and effectively corresponds to circuitry that is included in the controller 8 in the prior art setups shown in FIGS. 1 and 2. The fact that it is included in the device 15 of the disclosed technology results in a multifunctional device that allows the application of a modulated force on the AFM probe and the real-time acquisition of the spreading resistance in a single device. The way in which the device of FIG. 5 is implemented in the SSRM setup is shown in FIG. 6.

Figure 7:
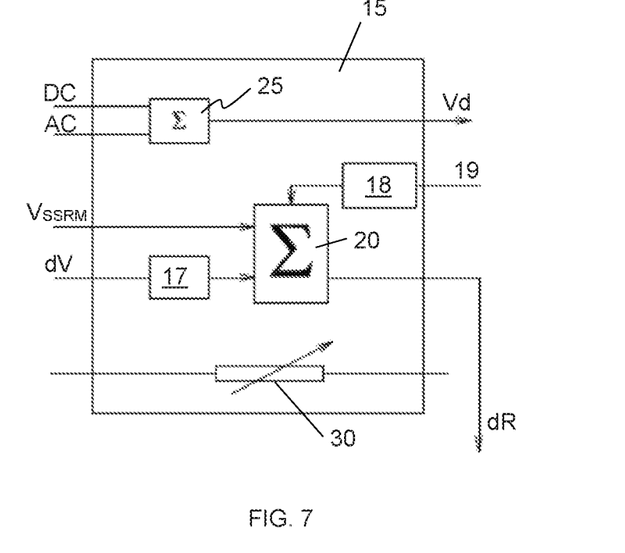
FIG. 7 shows an embodiment of the device further comprising the capability of adding a series resistance to the current path applied in an SSRM measurement.

FIG. 7 shows another embodiment which has an additional capability. Any SSRM measurement on a sample is accompanied by the measurement of a calibration standard, which is a sample with known carrier concentration levels. The combination of the SSRM measurement and the calibration measurement enables the creation of a 2D map of active carrier densities in the sample by correlating the SSRM resistance values measured on the sample to the known carrier density levels on the calibration standard.

Figure 8:
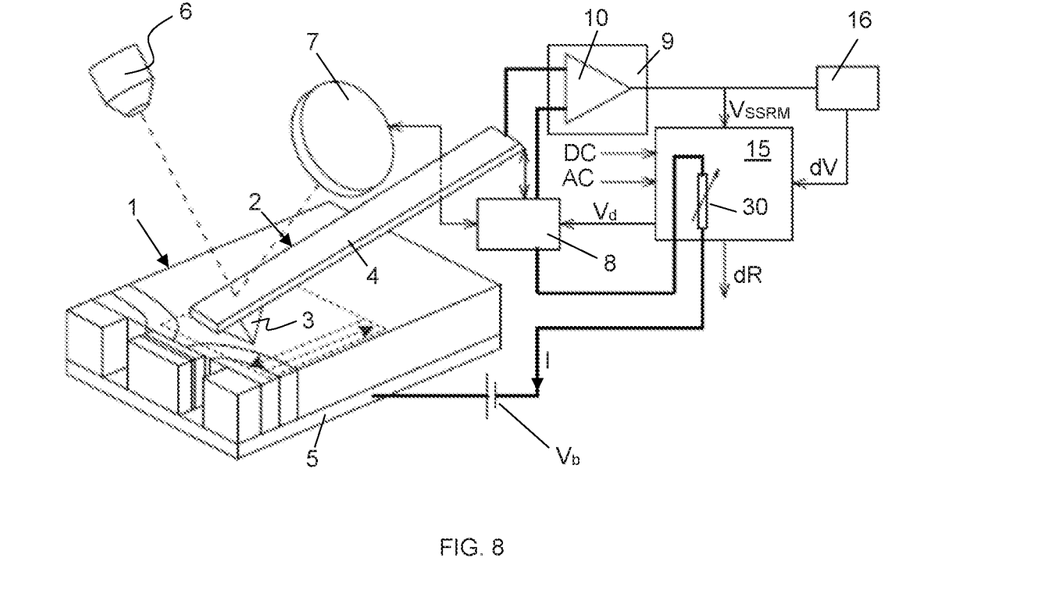
FIG. 8 shows the integration of the device of FIG. 6 into an SSRM measurement setup.

When the series resistance $R_{series}$ in formula (1) dominates the SSRM measurement, it becomes impossible to filter out this series resistance even when applying FFT-SSRM. The correlation between the measured resistance on a sample and on the calibration standard fails because the calibration measurement does not include the same high series resistance. For this reason, the embodiment of FIG. 7 allows to intentionally add a tuneable series resistance 30 to the current path. By adding this resistance to the path during the calibration measurement, the calibration result becomes representative for the test measurement and the correlation can be made correctly. The implementation of the device according to this embodiment in an SSRM setup is illustrated in FIG. 8. When the tuneable resistor is set to zero, the setup of FIG. 6 is reproduced. In the embodiment of FIGS. 7 and 8, the capabilities of producing a drive signal for the AFM tool and of adding a series resistance to the current path are both included in the device. The disclosed technology also includes embodiments wherein only one of these two capabilities is included.

The details of how the various building blocks shown in FIGS. 4, 5 and 7 may be implemented in practice are within the capabilities of the skilled reader and therefore not described here in detail. The signal processing device of the disclosed technology may be implemented as an analogue device or as a digital device. The main building blocks shown in FIG. 4 may be brought into practice in the form of digital components implemented in an integrated circuit. The device may be produced as a separate electrical apparatus comprising said integrated circuit or the equivalent analogue circuitry, and further provided with manually operable interfaces such as knobs or dials for setting a number of parameters. For example, the embodiment of FIG. 7 when executed as a stand-alone box would require knobs or dials for setting the DC signal, the amplitude and frequency of the AC signal, and the value of the tuneable resistor 30. When produced as a separate apparatus, the device of the disclosed technology is configured to be added to an SSRM measurement setup as known in the art.

According to an embodiment, the device of the disclosed technology is usable not only for measuring dR but also for measuring any electrical characteristic A of the current path originating from a logarithmic amplifier. These embodiments may require additional inputs and circuitry, but the basic formula for calculating the characteristics will always be a formula that is similar to formula (3) in the following manner:

$$\log_{10} A = \pm V_{SSRM} \pm \log_{10} dV + V_{multiplier} \qquad (9)$$

The choice between + or − depends on whether a positive or a negative bias voltage $V_b$ is applied to the sample. The term $V_{multiplier}$ is a constant that depends on the characteristic that is being measured. Table 1 shows the various multiplier values for measuring a number of electrical characteristics. 'z amplitude' is the constant amplitude of the AC component of the z-displacement imposed on the probe (obtainable from the AFM tool in the form of a signal). ω equals $2\pi f$ with f the frequency of the AC modulation. The 'gain' is the gain factor of the lock-in amplifier, i.e. the ratio between the amplitude of the AC component of the input signal, at the frequency for which the lock-in amplifier is set, and the amplitude of the output signal of the lock-in amplifier.

$Z_d$ is the dynamic impedance of the current path when the modulation is not applied to the AFM probe but to the bias voltage, i.e. the bias voltage $V_b$ is the superposition of a DC voltage $V_{DC}$ and an AC modulation with amplitude $V_{AC}$ and frequency f. The formula for $V_{multiplier}$ is again based on a first order approximation, as explained hereafter. With an AC modulation $V_{AC}$ added to the DC bias voltage $V_{DC}$, the dynamic current $I_{AC}$ can be written as:

$$I_{AC} \cong \frac{1}{2}\left(\frac{V_{DC}}{\min R} - \frac{V_{DC}}{\max R}\right) = \frac{V_{DC}}{2}\left(\frac{1}{10^{V_{SSRM}-dV}} - \frac{1}{10^{V_{SSRM}+dV}}\right)$$

In analogy with the derivation of dR given above, this can be written as:

$$\frac{V_{DC}}{10^{V_{SSRM}}}\frac{1}{2}(e^{dV\ln 10} - e^{-dV\ln 10}) =$$
$$\frac{V_{DC}}{10^{V_{SSRM}}}\sinh(dV \cdot \ln 10) \cong \frac{V_{DC}}{10^{V_{SSRM}}}dV \cdot \ln 10$$

The dynamic impedance Zd can thus be written as:

$$Z_d = \frac{V_{AC}}{I_{AC}} = \frac{10^{V_{SSRM}}}{dV}\frac{V_{AC}}{V_{DC}\ln 10} \qquad (10)$$

The logarithm of this function yields formula (9), with the $V_{multiplier}$ term as stated in table 1.

The formula for the capacitance of the current path $C_{eq}$ can be derived from a similar approximation, which further requires the assumption that the capacitance is coupled in parallel to $R_{SSRM}$ and that $\omega \cdot R_{SSRM} \cdot C_{eq} \gg 1$.

In that case:

$$C \cong \frac{1}{j\, Z_d}$$

By substituting formula (10) therein, the formula for $C_{eq}$ is found.

|  | Positive bias | | | Negative bias | | |
|---|---|---|---|---|---|---|
| Output | $V_{SSRM}$ | $\log_{10}$ amp | $V_{multiplier}$ | $V_{SSRM}$ | $\log_{10}$ amp | $V_{multiplier}$ |
| Dr | + | + | $\log_{10} \dfrac{\ln 10}{\text{gain}}$ | + | − | $-\log_{10} \dfrac{\ln 10}{\text{gain}}$ |
| dR/dz | + | + | $\log_{10} \dfrac{\ln 10}{\text{gain} \cdot z\ \text{amplitude}}$ | + | − | $-\log_{10} \dfrac{\ln 10}{\text{gain} \cdot z\ \text{amplitude}}$ |
| $Z_d$ | + | − | $\log_{10} \dfrac{\text{gain} \cdot V_{AC}}{V_{DC} \cdot \ln 10}$ | + | + | $-\log_{10} \dfrac{\text{gain} \cdot V_{AC}}{V_{DC} \cdot \ln 10}$ |
| $Z_d/R$ | GND | − | $\log_{10} \dfrac{\text{gain} \cdot V_{AC}}{V_{DC} \cdot \ln 10}$ | GND | + | $-\log_{10} \dfrac{\text{gain} \cdot V_{AC}}{V_{DC} \cdot \ln 10}$ |
| $C_{eq}$ | − | + | $\log_{10} \dfrac{V_{DC} \cdot \ln 10}{V_{AC} \cdot \omega \cdot \ln 10}$ | − | − | $-\log_{10} \dfrac{V_{AC} \cdot \ln 10}{V_{AC} \cdot \omega \cdot \text{gain}}$ |

$$\frac{V_{AC}}{V_{DC}} << dV \cdot \ln 10.$$

The assumption $\omega \cdot R_{SSRM} \cdot C_{eq} >> 1$ is true when so the reliability of the formula for $C_{eq}$ can be controlled by controlling the ratio $V_{AC}$ to $V_{DC}$.

Table 1 finally comprises a formula for $Z_d/R$. The R in the table is in fact $R_{SSRM}$. As $R_{SSRM}$ equals $10^{V_{SSRM}}$, the first term in formula (9) is in fact zero, i.e. ground voltage. The capability of providing the ground voltage (or more generally a reference voltage) to the summation circuit 20 instead of the $V_{SSRM}$ voltage is to be regarded as a feature of a specific embodiment of the disclosed technology. An interface allows the operator to set the device to one of the two options: $V_{SSRM}$ or ground coupled to the summing circuit 20.

According to an embodiment, the device of the disclosed technology comprises one or more interfaces which allow to manually set which electrical characteristic is being measured by the device. This may include binary switches for setting the + or − sign in the formula where required. The device may furthermore be configured to automatically calculate any of the $V_{multiplier}$ terms in table 1 (and others possibly). This may be achieved by integrating the device of the disclosed technology into the controller 8 of the SSRM tool, and making the parameters $z_{amplitude}$, $V_{AC}$ and $V_{DC}$ directly available to the device in the form of representative signals produced by the controller. Alternatively, the device may be separate from the controller 8 and signal lines are provided from the controller to the device of the disclosed technology, which receives the required representative signals as inputs. In each case, the device comprises suitable offset circuitry (in replacement of or in addition to circuit 18 in the figures) for calculating $V_{multiplier}$ according to the selected electrical characteristic and for producing a signal representative of $V_{multiplier}$ as an input to the summing circuit 20. According to another embodiment, the calculation of $V_{multiplier}$ takes place separately based on the knowledge of the parameters $z_{amplitude}$, $V_{AC}$, $V_{DC}$, and a signal representative of $V_{multiplier}$ is created by a suitable offset circuit in addition to or in replacement of circuit 18.

The disclosed technology is equally related to the use of the device according to the above-described embodiments. In the most general formulation, this use can be described as a method for measuring an electrical characteristic of a current path that includes a probe for scanning spreading resistance microscopy (SSRM), a test sample, a back contact on the test sample, a bias voltage source and a logarithmic voltage amplifier. The steps of the method are set out in the appended claims. Relevant features of embodiments of the method of the disclosed technology are disclosed in the above-described paragraphs related to the operation of a device according to the disclosed technology.

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the disclosed technology, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

What is claimed is:

1. A device for measuring an electrical characteristic of a current path that includes a probe for scanning spreading resistance microscopy (SSRM), a test sample contacted by the probe, a back contact on the test sample, a bias voltage source (Vb) and a logarithmic SSRM amplifier, when a modulation at a predefined frequency is applied to either the contact force of the probe or to the bias voltage, the device comprising electronic circuitry for producing in real time a signal representative of the electrical characteristic, according to the formula:

$$\log_n A = \pm V_{SSRM} \pm \log_n(dV) + V_{multiplier}$$

where:
A is the electrical characteristic,
n is the base of the logarithmic function applied in the logarithmic SSRM amplifier,
$V_{SSRM}$ is the DC component of the signal produced by the logarithmic SSRM amplifier,
$\log_n(dV)$ is the logarithm of the modulation of the signal produced by the logarithmic amplifier, at the frequency of the modulation applied to either the contact force of the probe or to the bias voltage (Vb),
$V_{multiplier}$ is a constant that depends on the type of electric characteristic that is measured, and
the plus or minus signs depend on the sign of the bias voltage ($V_b$) and on the type of characteristic that is measured.

2. The device according to claim 1, further comprising circuitry for producing a drive signal ($V_d$) for driving the contact force or the bias voltage.

3. The device according to claim 1, further comprising a tuneable resistor configured to be included in the current path.

4. The device according to claim 1, wherein the electric characteristic is the modulation dR of the resistance of said current path when a modulation is applied to the contact force, and wherein $V_{multiplier}$ is $\log_n(\ln 10/g)$ with g an integer.

5. The device according to claim 1, wherein the device is produced as an electrical apparatus configured to be added to an SSRM measurement setup, the apparatus comprising input connections for receiving signals representative of $V_{SSRM}$ and dV and at least one output connection for delivering a signal representative of $\log_n A$.

6. The device according to claim 5, wherein the input connection for receiving a signal representative of dV is configured to be coupled to a lock-in amplifier arranged to produce said signal in real time.

7. The device according to claim 5, wherein the apparatus further comprises manual interfaces.

8. The device according to claim 7, wherein the manual interfaces comprise an interface that allows to select which electrical parameter is to be measured.

9. The device according to claim 1, comprising a summing circuit comprising inputs configured to receive signals which are respectively representative of $\pm V_{SSRM}$, $\pm \log_n(dV)$ and $V_{multiplier}$.

10. The device according to claim 9, configured to allow a reference voltage to be connected to the input configured to receive a signal representative of $\pm V_{SSRM}$, instead of said signal representative of $\pm V_{SSRM}$.

11. A method for measuring an electrical characteristic of a current path that includes a probe for scanning spreading resistance microscopy (SSRM), a test sample contacted by the probe, a back contact on the test sample, a bias voltage source ($V_b$) and a logarithmic SSRM amplifier, comprising:
applying a modulation at a predefined frequency to either the contact force of the probe or to the bias voltage (Vb),
measuring the output voltage $V_{SSRM} dV$ of the logarithmic SSRM amplifier, wherein $V_{SSRM}$ is the DC component of the signal produced by the logarithmic SSRM voltage amplifier and wherein dV is the modulation of the signal produced by the logarithmic amplifier, at the frequency of the modulation applied to either the contact force of the probe or to the bias voltage,
determining dV by a lock-in amplifier,
determining $V_{SSRM}$,
calculating the electrical characteristic on a logarithmic scale in real time by the function:

$$\log_n A = \pm V_{SSRM} \pm \log_n(dV) + V_{multiplier}$$

where:
A is the electrical characteristic
n is the base of the logarithmic function applied in the logarithmic SSRM amplifier,
$V_{multiplier}$ is a constant that depends on the type of electric characteristic that is measured, and
the plus or minus signs depend on the sign of the bias voltage ($V_b$) and on the type of characteristic that is measured.

12. The method according to claim 11, wherein a modulation is applied to the contact force, wherein the electric characteristic is the modulation dR of the resistance of said current pat, and wherein $V_{multiplier}$ is $\log_n(\ln 10/g)$ with g an integer.

* * * * *

UNITED STATES PATENT AND TRADEMARK OFFICE
CERTIFICATE OF CORRECTION

PATENT NO. : 10,495,666 B2
APPLICATION NO. : 16/026428
DATED : December 3, 2019
INVENTOR(S) : Kristof Paredis et al.

It is certified that error appears in the above-identified patent and that said Letters Patent is hereby corrected as shown below:

In the Specification

In Column 4, Line 10, change "$V_{SSRM}$ dV" to --$V_{SSRM}$+dV--.

In Column 4, Line 33, change "pat," to --path,--.

In Column 9, Line 31-32 (Approx.), above "The assumption" delete "$\frac{V_{AC}}{V_{DC}} \ll dV \cdot \ln 10.$".

In Column 9, Line 35 (Approx.), change "so" to --$\frac{V_{AC}}{V_{DC}} \ll dV \cdot \ln 10.$ So--.

In the Claims

In Column 12, Line 17, Claim 11, change "$V_{SSRM}$ dV" to --$V_{SSRM}$+dV--.

In Column 12, Line 42, Claim 12, change "pat," to --path,--.

Signed and Sealed this
Fifth Day of May, 2020

Andrei Iancu
*Director of the United States Patent and Trademark Office*